United States Patent
Hoffmann

[11] Patent Number: 5,844,313
[45] Date of Patent: Dec. 1, 1998

[54] HEAT SINK

[75] Inventor: Ingolf Hoffmann, Herzogenaurach, Germany

[73] Assignee: Siemens Aktiengesellschaft, München, Germany

[21] Appl. No.: 880,242

[22] Filed: Jun. 23, 1997

Related U.S. Application Data

[63] Continuation of Ser. No. 644,928, May 13, 1996, abandoned, which is a continuation of Ser. No. 356,744, Dec. 15, 1994, abandoned.

[30] Foreign Application Priority Data

Dec. 15, 1993 [DE] Germany ............... G 93 19 259.2

[51] Int. Cl.⁶ ........................................ H01L 23/34
[52] U.S. Cl. ................ 257/722; 257/712; 165/80.3; 361/703; 361/717
[58] Field of Search ................... 257/722, 712, 257/721; 165/80.3; 361/697, 703, 717, 718

[56] References Cited

U.S. PATENT DOCUMENTS

| 3,766,977 | 10/1973 | Pravda et al. | 257/722 |
| 4,541,004 | 9/1985 | Moore | 257/722 |
| 4,899,210 | 2/1990 | Lorenzetti et al. | 257/722 |
| 4,918,571 | 4/1990 | Grabbe | 257/722 |
| 5,079,635 | 1/1992 | Koshiyouji et al. | 257/722 |

FOREIGN PATENT DOCUMENTS

| 2 486 308 | 1/1982 | France . |
| 1 840 491 | 11/1961 | Germany . |
| 1 865 970 | 1/1968 | Germany . |
| 1 978 284 | 2/1968 | Germany . |
| 69 10 755 | 12/1969 | Germany . |
| 69 34 711 | 12/1969 | Germany . |
| 16 14 587 | 10/1970 | Germany . |
| 70 26 435 | 12/1970 | Germany . |
| 1 960 957 | 6/1971 | Germany . |
| 25 31 450 | 1/1977 | Germany . |
| 30 24 748 | 9/1986 | Germany . |
| 35 18 310 | 5/1989 | Germany . |
| 36 17 611 | 12/1989 | Germany . |
| 0 651 719 | 9/1985 | Switzerland . |
| 2 153 151 | 8/1985 | United Kingdom . |
| 2 204 181 | 11/1988 | United Kingdom . |
| 2 240 425 | 7/1991 | United Kingdom . |

OTHER PUBLICATIONS

Conrad Electronic Catalog 1990, p. 495.
Siemens Zeitschrift, vol. 42, 1968, No. 7, pp. 521–527.
Catalog from the firm SEIFERT Electronic, 1993, pp. 6–107.

Primary Examiner—David Ostrowski
Attorney, Agent, or Firm—Kenyon & Kenyon

[57] ABSTRACT

A heat sink for semiconductor components has a fin base and a plurality of spaced fins that all have the same height. A side of the base facing the fins is configured convexly with respect to the side of the fin base facing the semiconductor component, so that when the heat sink is used as intended, the roots of its fins are arranged on a surface of constant temperature. This yields a finned heat sink that attains a heat flux density hitherto achievable only with evaporative or fluid coolers.

19 Claims, 3 Drawing Sheets

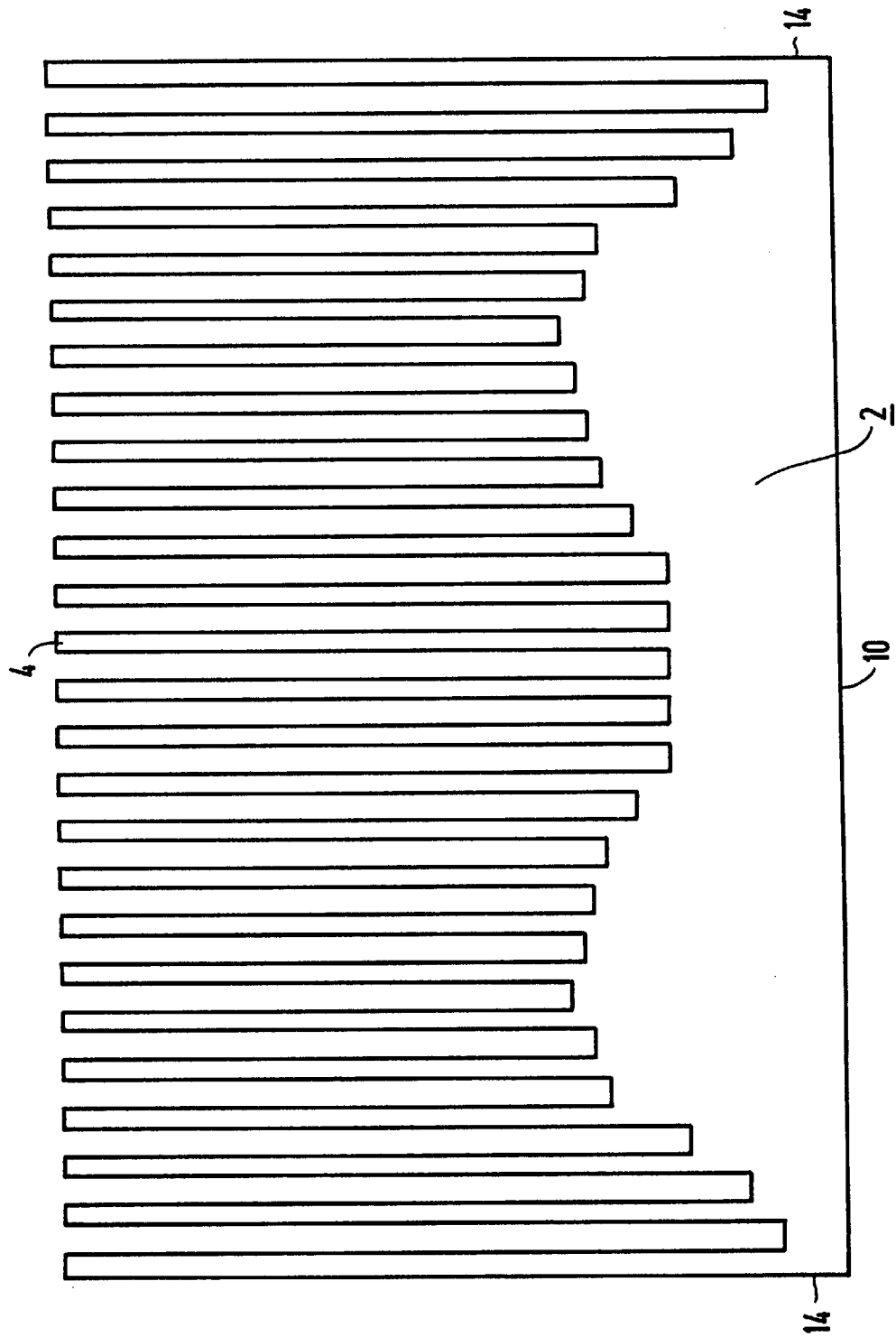

HEAT SINK

This application is a continuation of application Ser. No. 08/644,928, filed on May 13, 1996, now abandoned, which is a continuation of Ser. No. 08/356,744, filed Dec. 15, 1994, now abandoned.

BACKGROUND OF THE INVENTION

The present invention relates to a heat sink for one or more semiconductor components where the heat sink includes a fin base and a plurality of spaced fins having the same height.

Heat sinks for transferring heat away from semiconductor devices are currently commercially available (see the Seifert Electronics "Components" catalog 1993). Cooling fins applied to a heat emitting surface improve heat transfer from the surface to the surrounding medium. Disks or needles are occasionally used instead of fins. The effect of these appliances is to increase the effective surface area of the original heat emitting surface, thus increasing the rate of heat transfer.

Heat sinks suffer from certain physical limitations. For example, increasing the surface area does not always produce a concomitant increase in the heat transfer rate. Individual segments of the heat sink interact by radiating some of the heat to each other, interfering with the efficient transfer of heat from the heat emitting surface to which the heat sink is affixed. Likewise, the segments naturally become cooler as they proceed away from the heat emitting surface. This reduces the rate of heat transfer, which is proportional to the temperature difference between the segments and the surrounding medium.

Despite these limitations, the heat sink's simplicity and low cost render it a popular choice for cooling components, assemblies and devices. One advantage is that the geometry of finned heat sinks can be readily adapted to accommodate the often complex geometry of the item to be cooled and its surrounding space. To this end, there are heat sinks that may be finned with a flat base surface, tubular with a cylindrical or tapered base surface, and so on. The fins can be segmented or continuous. There are presently a wide variety of heat sinks available commercially, adapted to function in multitudinous situations.

The most common configuration is that of a flat surface with straight lengthwise fins. This shape is particularly easy to size for the appropriate heat transfer rate because it lends itself to the simplifying assumption of a constant heat transfer coefficient, making it easier to size for a given situation using a simplified version of the heat transfer equation.

The heat transfer equation indicates that the rate of convective heat transfer is proportional to the surface area of the heat emitting body and the difference in temperature between the body and its surrounding medium. The proportionality constant, $\alpha$, is called the heat transfer coefficient. $\alpha$ depends upon the specific geometry of the emitting body and the physical characteristics of the surrounding medium. It is determined experimentally in all but the most straightforward situations.

Convective heat transfer is governed by a very simple law according to which the heat flux $\dot{Q}$ (heat per unit time) is proportional to the heat transfer index $\alpha$, the device surface area A, and a temperature difference $\Delta\theta$. In simple cases, the temperature difference is represented by the wall and ambient temperatures. The heat transfer index $\alpha$ depends on the properties and velocity of the surrounding fluid phase, and on the geometric configuration of the device surface. The latter correlation can be so intricate that one is almost always compelled to determine the heat transfer index experimentally. In conjunction with similitude theory, however, it is then possible to write quite reliable equations with a wide range of applicability. In the article "The fin as cooling element," appearing in the German periodical "Siemens-Zeitschrift," vol. 42, 1986, no. 7, pages 521 to 527, the intricate correlations among the many variables influencing heat transfer are each depicted in the form of an equation. These formulas indicate the complex correlations among the individual variables influencing convective heat transfer. Since in most cases, the temperature gradient (overtemperature) can be calculated only from the heat transfer coefficient $\alpha$, and it in turn influences the magnitude of the heat transfer coefficient $\alpha$ and the physical characteristics, the solution can only be found after repeated calculation runs (iterative method).

Commercially available extruded heat sinks generate a heat flux density of only about 10 kJ/sm$^2$. Pressed-in fins generate a heat flux density of 22 kJ/sm$^2$. Higher flux densities can only be achieved with evaporative or fluid coolers. These systems are much more expensive and more complicated than conventional heat sinks.

In presently available switched power converter modules, such as bipolar power transistors (PTR) and insulated-gate-bipolar transistors (IGBT), up to 1400 W power must be dissipated. This involves heat flux densities of up to 80 kJ/sm$^2$. For comparison, a household cooking surface generates a heat flux density of about 30 kJ/sm$^2$. For cost reasons and in the interest of low complexity, this power must be dissipated with a heat sink through forced convection.

SUMMARY OF THE INVENTION

The present invention envisions a heat sink comprising a specially shaped fin base and a plurality of spaced fins that have the same height, to be used for efficiently dissipating heat from semiconductor components such as switched power converter modules.

The most efficient design for a heat sink of this kind mandates that the base of fins be attached to a surface of constant temperature (an isotherm). This way, the same dissipated power is conveyed to each cooling fin of the heat sink, producing a constant fin efficiency across the entire cross section of the heat sink. This improves upon the efficiency of known heat sinks, whose fin efficiencies vary depending upon the temperature variations at their attachment points to the their base.

The present invention creates an isothermal surface at the base of the fins by curving the side of the fin base facing the fins in a convex fashion with respect to the side of the base facing the semiconductor component.

In one embodiment of the present invention, the base surface area of the heat sink is larger than the base surface of area of the semiconductor component. To maintain the isothermal surface at the base of the fins, the side of the fin base facing the fins has a ridge-shaped convexity around its edges.

The fin base of the present invention is thin, increasing the temperature of the isotherm upon which the fin bases sit. This further increases the overall efficiency of the heat sink.

The fins of an embodiment of the present invention end in a plane that runs parallel to the semiconductor component. This results in a square or cuboidal geometry for the heat sink, similar to currently available heat sinks.

BRIEF DESCRIPTION OF THE DRAWINGS

For further elucidation, reference is made to the drawings in which several exemplary embodiments of the heat sink according to the present invention are schematically illustrated.

FIG. 4 illustrates a further advantageous heat sink according to the present invention.

DETAILED DESCRIPTION

Figure 1:
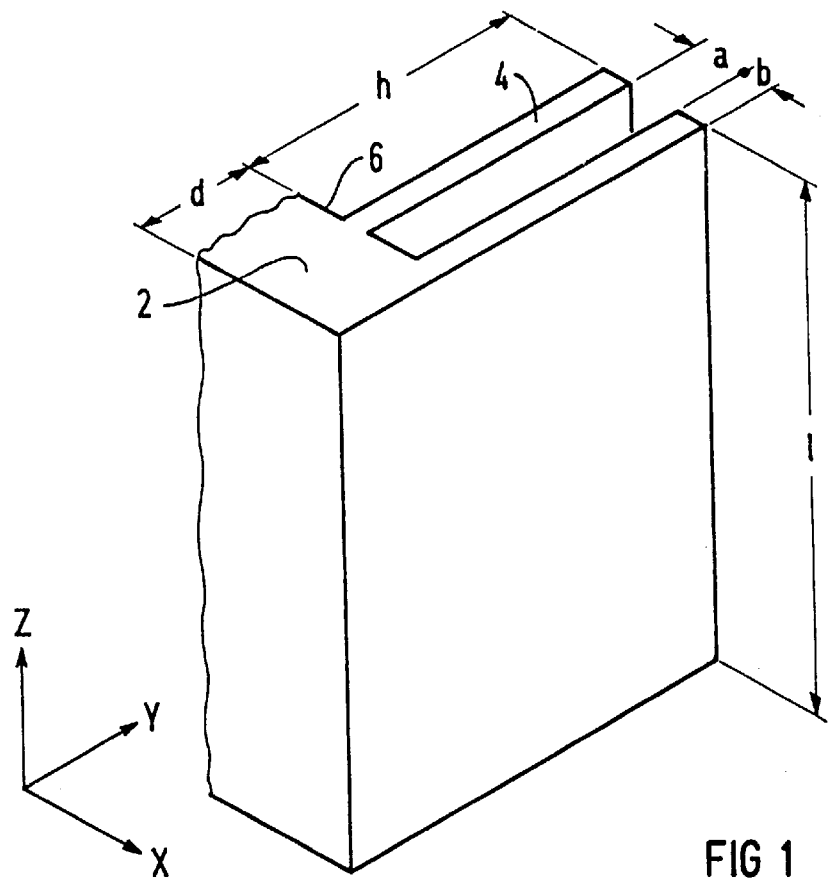
FIG. 1 shows a section of a conventional heat sink.

FIG. 1 shows a section of a conventional heat sink that consists of a fin base 2 and a plurality of spaced fins 4, only two of which are illustrated in this sectional depiction. The height of fin 4 is indicated as h, and its thickness as b. The length of fin 4 and of the heat sink is further indicated as l. With reference to this depiction, z is the lengthwise coordinate and x the width coordinate of the heat sink. The thickness or height of fin base 2 is indicated as d, and the spacing between each fin 4 as a.

Heat enters fin 4 from the interior of fin base 2 and is emitted by the fin flanks to the environment by convection. A very small proportion of the heat is always transferred directly from fin base surface 6 to the environment. The expression $$\dot{Q} = \alpha H \Delta \theta$$

can be written for the rate $\dot{Q}$ at which heat is emitted by fin 4 to the environment, where H is the fin surface area, $\alpha$ the heat transfer coefficient, and $\Delta\theta$ the temperature difference between a temperature averaged over fin height h and the temperature of the surrounding medium. It is known from "Siemens-Zeitschrift" vol. 42, no. 7, that the fin efficiency is always less than 1, and that for as much heat as possible to be emitted by a fin 4, this fin efficiency should deviate as little as possible from unity. The fin efficiency depends on the "fin parameter," a dimensionless number that is calculated from the thermal conductivity $\lambda$ of the fin material, the fin height h, fin thickness b, and heat transfer coefficient $\alpha$. Fin efficiency decreases as the fin parameter rises. To obtain high values for fin efficiency, the fin parameter must decrease, i.e., the fin height h must be small and the fin thickness b large. As the fin height h becomes smaller, however, the fin surface area H also becomes considerably smaller. Moreover, low values for the fin parameter also result when the thermal conductivity $\lambda$ of the fin material is high.

Since it is always desirable to dissipate the greatest possible heat flux $\dot{Q}$ from the fin surface H to the environment, according to the above equation the average fin temperature must be increased. Thus according to the equation the heat flux $\dot{Q}$ changes not proportionally, but rather less than proportionally with respect to the heat transfer coefficient $\alpha$. It follows from these explanations that the increase in heat transfer coefficient $\alpha$ does not by any means lead to a similar increase in the heat $\dot{Q}$ emitted from fin 4, since an increase in heat transfer coefficient $\alpha$ causes a reduction in the temperature difference $\Delta\theta$.

In a heat sink, a plurality of fins 4 are always arranged spaced apart next to one another. The fin spacing a is always very small, which strongly influences heat emission. There thus forms at the flanks of fins 4, which experience parallel flow of the surrounding medium, a boundary layer with respect to both speed and temperature. This boundary layer is greater for a small fin spacing a than for a large one. Particularly thick boundary layers occur at the fin root. Since, to a first approximation, the heat transfer coefficient $\alpha$ is inversely proportional to the boundary layer thickness, the heat transfer coefficient $\alpha$ has its lowest value at the fin root, and this index increases toward the fin tip. To improve efficiency, an effort is made to obtain a heat transfer coefficient $\alpha$ that is constant over the fin height. For this purpose, the flow is directed so that it affects the vicinity of the fin root with particular strength.

Calculating the fin efficiency always requires a knowledge of the heat transfer coefficient $\alpha$. Note that heat transfer coefficient $\alpha$ can be determined in no other way than by experiment; because of the very intricate flow conditions, theoretical calculations are not yet possible. The simplest case exists when the flow passes lengthwise along the fins, and the fins form lateral delimiting walls for flow channels. In this case the equation $$\alpha = (\lambda/l)\, Nu$$

is used for calculation, where Nu is the Nusselt number, which in turn depends on the Grashof number Gr, Prandtl number Pr, and Reynolds number Re. The Grashof number Gr is of importance only for calculating heat transfer processes with unrestricted convection. The equation for the heat transfer coefficient $\alpha$ has a very wide range of application. It applies to practically all Reynolds numbers Re above 2320, and for Prandtl numbers Pr above approximately 0.5.

With these formulas, an iterative optimization process can be used to determine the expected fin heat dissipation capacity. The number n of fins 4 in the heat sink is then determined from the total power $P_G$ to be dissipated and the fin capacity $Q_R$. However, this applies only if the same dissipated power $P_R$ is conveyed to each heat sink fin 4.

This criterion can be met only if, according to the invention, all the roots of fins 4 of the heat sink stand on a surface of constant temperature. In other words, a side 6 of fin base 2 facing fins 4, also called the fin base upper surface, is convex in shape with respect to a side 10 of fin base 2 facing a semiconductor component 8, also called the fin base lower surface. With this configuration of the high-capacity heat sink according to the invention, the total power $P_G$ being dissipated can be divided by the fin capacity $P_R$ to obtain the number n of fins 4 for that heat sink. The same dissipated power $P_R$ is conveyed to each fin 4.

Figure 2:
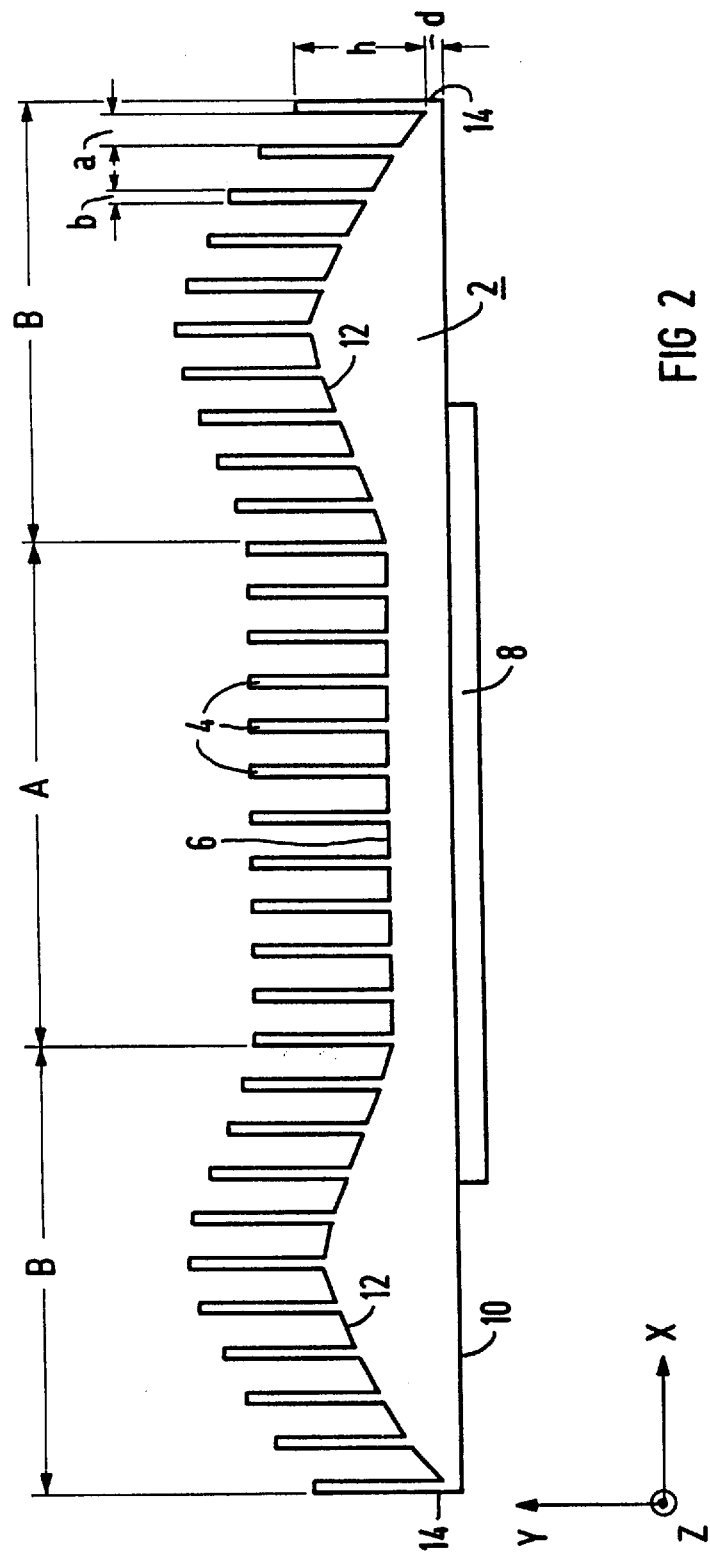
FIG. 2 shows an advantageous heat sink according to the present invention.

FIG. 2 shows a heat sink according to the invention in cross section, for a semiconductor element 8; the base surface area of the heat sink 10 is larger than the base surface area of semiconductor component. This arrangement allows for a minimal temperature gradient in fin base 2, thus producing realistic values for the thickness d of fin base 2. The edge region, marked B, of fin base upper surface 6 is provided with a ridge-shaped convexity 12 that slopes toward edge 14 of the heat sink. Ridge-shaped convexity 12 is configured so that a small temperature difference $\Delta\theta_R$, for example, $\Delta\theta_R = 0.3$ K, occurs between adjacent fins 4. In the center A of the heat sink, the roots of fins 4 are arranged on a surface of constant temperature, i.e., no temperature difference $\Delta\theta_R$ occurs between adjacent fins 4. This embodiment yields a high-capacity heat sink, in which the same dissipated power $P_R$ is conveyed to each cooling fin 4, and the total power $P_G$ to be dissipated is determined from the number n of cooling fins 4.

When this heat sink is provided for one semiconductor component 8, the base surface of the heat sink is square and ridge-shaped convexity 12 forms a continuous ring, i.e., the profile depicted in FIG. 2 also extends in the z direction of the heat sink. When a plurality of semiconductor components 8 needs to be cooled by means of one heat sink, heat sinks matching the number of semiconductor components 8, and attached directly to one another, can be provided for individual elements. Heat sinks of this kind for one or more components 8 can be produced by casting methods. If, on the other hand, the heat sink is to be produced from extruded profiles, the profiling depicted is omitted in the z direction of the heat sink, i.e., the profile depicted in FIG. 2 remains constant along the z direction of the heat sink.

Figure 3:
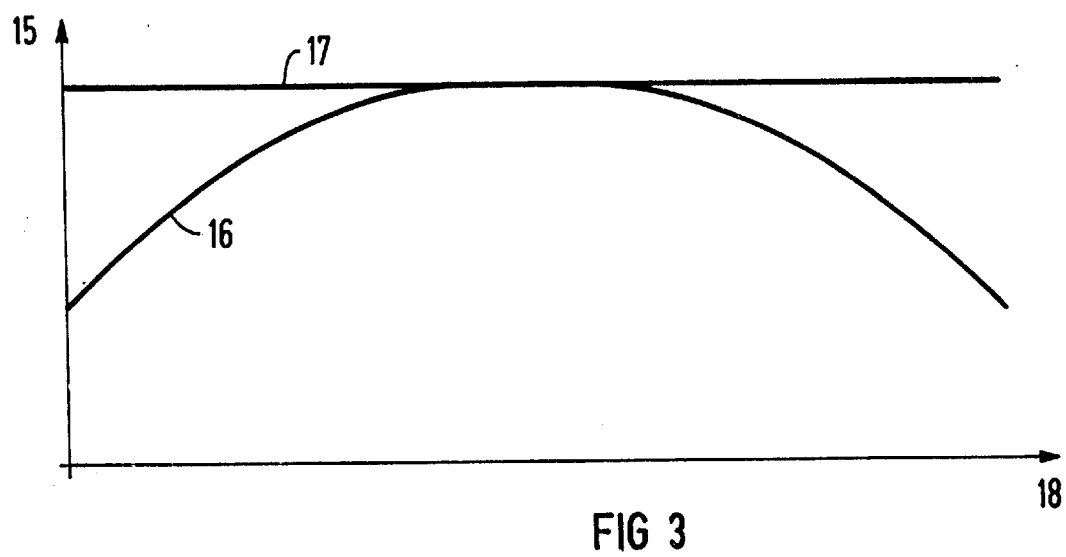
FIG. 3 is a plot comparing the efficiency 15 of a conventional heat sink and of the heat sink according to the present invention over the heat sink cross section.

FIG. 3 depicts, in a diagram, the efficiency 15 of a conventional heat sink 16 and of a high-capacity heat sink 17 according to the invention, over the heat sink cross-section 18. It is evident from this diagram that not far from the center of the conventional heat sink, the efficiency is already decreasing perceptibly, while efficiency of the high-capacity heat sink remains constant over its entire cross-section. In other words, the base surface area of the conventional heat sink must be several times greater than the base surface area of a high-capacity heat sink according to the present invention in order to dissipate heat at the same rate.

FIG. 4 depicts a further advantageous embodiment of the high-capacity heat sink. In this embodiment the ends of fins 4 all end in a plane that lies parallel to fin base lower surface 10 of fin base 2. This results in a cuboidal volume, just like commercially available heat sinks. This heat sink is dimensioned as an extruded profile for four semiconductor components 8, i.e., the profile depicted extends unchanged in the z direction of the heat sink. The heat sink has the dimensions 250 mm×170 mm×750 mm, and has 25 fins 4. The semiconductor components 8, in particular IGBT modules, each have a base surface area of 130×140 mm. With an air volume flow of 1700 $m^3/h$ produced by a fan, 1350 W per module can be dissipated, with a temperature rise at the module of $\Delta T=50$ K., where the air is heated 13 K. This results in this case in a higher heat flux density than can be achieved with currently available conventional heat sinks with cooling fins.

What is claimed is:

1. A heat sink for dissipating heat from an adjacent semiconductor component, comprising:
    a fin base having an upper surface and a lower surface, at least a portion of the upper surface of the fin base having a substantially dome-shaped convex profile, the upper surface of the fin base providing a substantially uniform temperature distribution when the heat sink is dissipating heat from the semiconductor component; and
    a plurality of spaced fins disposed on the upper surface, at least some of the plurality of spaced fine being disposed on a central area of the upper surface, all of the plurality of spaced fins having a substantially same height.

2. The heat sink of claim 1, wherein a base surface area of the heat sink is larger than a base surface area of the semiconductor component and wherein the fin base includes an edge region, the edge region including the at least portion of the upper surface having the substantially dome-shaped convex profile, the at least portion of the upper surface having a first sloping portion which slopes downward to an edge of the heat sink, and a second sloping portion which slopes downward to the central area.

3. The heat sink of claim 2, wherein the thickness of the fin base is thin.

4. The heat sink according to claim 2, wherein all the fins end in a plane that extends parallel to the semiconductor component.

5. The heat sink of claim 1, wherein the thickness of the fin base is thin.

6. The heat sink according to claim 1, wherein all the fins end in a plane that extends parallel to the semiconductor component.

7. The heat sink of claim 1, wherein the heat sink is an extruded profile.

8. The heat sink of claim 1, wherein the heat sink is a cast part.

9. A heat sink device for dissipating heat from a plurality of adjacent semiconductor components, comprising a plurality of component heat sink units, each heat sink unit comprising:
    a fin base having an upper surface and a lower surface, at least a portion of the upper surface of the fin base has a substantially dome-shaped convex profile, the upper surface of the fin base providing a substantially uniform temperature distribution when the heat sink is dissipating heat from the semiconductor component; and
    a plurality of spaced fins disposed on the upper surface, at least some of the plurality of spaced fins being disposed on a central area of the upper surface, all of the plurality of spaced fins having a substantially same height;
    wherein said component heat sink units are attached directly to one another in the lengthwise direction of the fins.

10. A heat sink device for dissipating heat from a plurality of semiconductor components adjacent to the heat sink device, the heat sink device comprising a plurality of component heat sink units, each heat sink unit comprising:
    a fin base having an upper surface and a lower surface, the fin base having a surface area that is greater than a base surface area of a corresponding one of the plurality of semiconductor components, an edge region of the upper surface of the fin base having a substantially dome-shaped convex profile, the edge region including a first sloping portion which slopes downward to an edge of the heat sink, and a second sloping portion which slopes downward to a central area of the fin base, and the upper surface of the fin base providing a substantially uniform temperature distribution when the heat sink is dissipating heat from the corresponding one of the plurality of semiconductor components; and
    a plurality of spaced fins disposed on the upper surface, at least some of the plurality of spaced fins being disposed on a central area of the upper surface, all of the plurality of spaced fins having a substantially same height;
    wherein said component heat sink units are attached directly to one another in the lengthwise direction of the fins.

11. A heat sink according to claim 10, wherein the cross-sectional area remains constant along the entire heat sink for a plurality of semiconductor components.

12. The heat sink according to claim 10, wherein said plurality of spaced fins all have the same height.

13. A heat sink for dissipating heat from an adjacent semiconductor component, comprising:
    a fin base having an upper surface and a lower surface, the fin base having a base area, the base area being larger than a base area of the adjacent semiconductor component, an edge region of the upper surface of the fin base having a substantially dome-shaped convex profile, and the upper surface of the fin base providing a substantially uniform temperature distribution when the heat sink is dissipating heat from the adjacent semiconductor component; and a plurality of spaced fins disposed on the upper surface, at least some of the plurality of spaced fins being disposed on a central area of the upper surface.

14. The heat sink according to claim 13, wherein the fin base is square shaped, and wherein the edge region forms a raised closed ring.

15. The heat sink according to claim 13, wherein the fin base is rectangular shaped.

16. The heat sink according to claim 13, wherein all of the plurality of fins have a substantially same height.

17. The heat sink according to claim 13, wherein each of the plurality of fins has a distal end, the distal end being distal to the fin base, each distal end of all of the plurality of fins together forming a plane spatially parallel to the lower surface of the fin base.

18. The heat sink according to claim 13, wherein the heat sink is a cast part.

19. A heat dissipating device, comprising:

a semiconductor component having a base area;

a heat sink dissipating heat from the semiconductor component, the heat sink including:

a fin base having an upper surface and a lower surface, the lower surface being adjacent to the semiconductor component, the fin base having a base area larger than the base area of the semiconductor component, an edge region of the upper surface of the fin base having a substantially dome-shaped convex profile, the edge region including a first sloping portion which slopes downward to an edge of the heat sink, and a second sloping portion which slopes downward to a central area of the fin base, and the upper surface of the fin base providing a substantially uniform temperature distribution when the heat sink is dissipating heat from the semiconductor component, and a plurality of spaced fins disposed on the upper surface of the fin base, at least some of the plurality of fins being disposed on the central area of the upper surface of the fin base.

* * * * *